United States Patent [19]
Aoki et al.

[11] Patent Number: 5,635,053
[45] Date of Patent: Jun. 3, 1997

[54] METHOD AND APPARATUS FOR CLEANING ELECTRONIC PARTS

[75] Inventors: Hidemitsu Aoki; Masaharu Nakamori, both of Tokyo; Koji Yamanaka, Saitama; Takashi Imaoka, Saitama; Takashi Futatsuki, Saitama; Yukinari Yamashita, Saitama, all of Japan

[73] Assignees: NEC Corporation; Organo Corporation, both of Tokyo, Japan

[21] Appl. No.: 549,646

[22] Filed: Oct. 27, 1995

[30] Foreign Application Priority Data

Oct. 28, 1994 [JP] Japan .................. 6-265811

[51] Int. Cl.$^6$ .................................... C02F 1/461
[52] U.S. Cl. .................. 205/746; 205/747; 205/751; 205/770; 204/252; 204/263; 204/264; 204/275; 204/276; 134/28; 134/109

[58] Field of Search ................. 205/746, 747, 205/751, 770; 204/252, 263, 264, 275, 276; 134/3, 109, 28

[56] References Cited

U.S. PATENT DOCUMENTS 4,828,660  5/1989  Clark et al. .................. 204/82

*Primary Examiner*—Arun S. Phasge
*Attorney, Agent, or Firm*—Fish & Richardson P.C.

[57] ABSTRACT

Electric parts including semiconductor substrates, glass substrates and the like are washed with various cleaning solutions. After the cleaning, said parts are cleaned with either anolyte or catholyte electrolytic ionized water (EIW) produced from deionized water.

21 Claims, 4 Drawing Sheets

METHOD AND APPARATUS FOR CLEANING ELECTRONIC PARTS

FIELD OF THE INVENTION

The present invention relates to a method and apparatus for cleaning electronic parts or the like such as semiconductor substrates which are required to have extremely clean surfaces.

DESCRIPTION OF THE RELATED ART

A conventional method for cleaning electronic parts or the like which are required to have extremely clean surfaces will be described with reference to the method for cleaning silicon wafers used for LSI manufacturing as an example.

In the process of manufacturing LSI chips, an insulator film of material such as $SiO_2$ is formed on the surface of the silicon wafer, etched in a predetermined pattern to expose the silicon underneath said insulator film, cleaned, and elements of p-type or n-type are introduced forming embedded metal such as Al patterns. Said steps are repeated to complete the LSI chips.

At the time of introducing elements of p-type or n-type, or in the process of forming embedded metal patterns on the chips, adhesion of impurities such as particulate foreign materials, metals, organic matter and natural oxide films to the exposed surface of silicon may lead to the degradation of the chip's characteristics including, for example, deficient electrical connection between the metal and the silicon and an increase in contact resistance.

Therefore, in the process for manufacturing LSI chips, the surface cleaning step is very important for producing high performance chips, requiring as much removal of impurities adherent to the wafer surface as possible.

Conventionally, for example, the following techniques have been used for cleaning semiconductor wafers. That is, a sulfuric acid-hydrogen peroxide mixture solution, a hydrochloric acid-hydrogen peroxide mixture solution, a ammonium hydroxide-hydrogen peroxide mixture solution, a hydrofluoric acid solution, an ammonium fluoride solution, high-purity water and any combination thereof are used in the process to remove organic matter, particles, metals or natural oxide films adherent to the surfaces of semiconductors without damaging the flatness of the surface of the semiconductor at atomic level. An example of said process will be described below.

Although high-purity water described above generally means secondary pure (deionized) water produced by a high purity water producing system equipped with a secondary purification section in addition to a primary purification section which produces primary deionized water, it is not necessarily defined based on the purification process. Any suitable highly purified water is sufficient for cleaning electronic components or the like which are required to have extremely clean surfaces. In the present application, "pure water" includes "deionized water" and "high purity water".

In the cleaning process of wafers, in order to contact cleaning agents or high-purity water to their surface, a batch type cleaning method is frequently used, wherein a plurality of wafers are soaked batchwise in a cleaning bath containing cleaning agents (or high-purity water). Furthermore, the following systems are known. Circulation and filtration of reagents in the cleaning bath to prevent contamination thereof during the cleaning process, an overflow rinse system, wherein high-purity water is supplied from the bottom of the cleaning bath and overflowed from the top, and a quick dump rinse system, wherein high-purity water fills the cleaning bath once deep enough to soak the entire surface of wafers and then is dumped from the bottom in a single action. Recently, in addition to the said batch type cleaning method, there has been used a method for showering the wafer surface with reagents and high-purity water, and spraying reagents and high-purity water to the center of wafers rotating at high speed.

Now the role of each step of the cleaning process divided into a plurality of steps described above as a whole will be explained. Cleaning with sulfuric acid-hydrogen peroxide solution (1) is mainly to remove the organic matter adherent to the surface. Said cleaning with ammonium hydroxide-hydrogen peroxide (5) is mainly to remove the particulates adherent to the surface, said cleaning with hydrochloric acid-hydrogen peroxide (9) is mainly to remove metal impurities adherent to surface, and said cleaning with hydrofluoric acid (3), (7) and (11) is to remove the native oxide film on the surface.

Furthermore, although the main purpose of each cleaning step is described above, each cleaning solution is often capable of removing other contaminants than those principal ones. Since, for example, said sulfuric acid-hydrogen peroxide solution (1) also has a powerful ability to remove adherent metallic impurities, in addition to adherent organic matter, a method is also available for removing a plurality of contaminating objects with a single cleaning solution, in addition to the method for removing one category of impurities with one cleaning solution described above. The

| | | |
|---|---|---|
| (1) | Cleaning with sulfuric acid-hydrogen peroxide (sulfuric acid:hydrogen peroxide solution = 4:1, by volume) | 10 min |
| (2) | Rinsing with high-purity water | 10 min |
| (3) | Cleaning with hydrofluoric acid (hydrofluoric acid, 0.5%) | 1 min |
| (4) | Rinsing with high-purity water | 10 min |
| (5) | Cleaning with ammonia-hydrogen peroxide (ammonia water:hydrogen peroxide solution: high-purity water = 0.05:1:5, by volume) | 10 min |
| (6) | Rinsing with high-purity water | 10 min |
| (7) | Cleaning with hydrofluoric acid (hydrofluoric acid, 0.5%) | 1 min |
| (8) | Rinsing with high-purity water | 10 min |
| (9) | Cleaning with hydrochloric acid-hydrogen-peroxide (hydrochloric acid:hydrogen peroxide solution: high-purity water = 1:1:6, by volume) | 10 min |
| (10) | Cleaning with high-purity water | 10 min |
| (11) | Cleaning with hydrofluoric acid (hydrofluoric acid, 0.5%) | 1 min |
| (12) | Rinsing with high-purity water | 10 min |
| (13) | Spin dehydration or IPA steam drying | 10 min | cleaning (or rinsing) treatment with high-purity water performed after the removing of adherent impurities with cleaning reagents step in the cleaning method described above is to rinse remaining reagents off from the surfaces, and high-purity water produced with a high-purity water producing system is usually used as the rinse water. This is because cleaning becomes meaningless if the contaminating materials adhere again to the surface of wafers which has become clean with no adherent impurities. Therefore, high-purity water from which particles, colloidal substances, organic matter, metals, anions, dissolved oxygen or the like have been mostly removed is used as the rinse water to remove cleaning reagents.

Such high-purity water is conventionally produced by a high-purity water producing apparatus in accordance with the following method.

That is, feed water is treated in a primary deionized water production section comprising a coagulation and sedimentation unit, sand filtration unit, active carbon adsorption unit, reverse osmosis unit, two-bed ion exchange unit, mixed-bed ion exchange unit, micronic filter unit and so forth to obtain primary deionized water, which is further treated in a secondary deionized water production section just before points of use.

In such a high-purity water producing apparatus, primary deionized water is stored in a primary deionized water reservoir, then subjected to secondary treatment using ultraviolet irradiation apparatus, mixed-bed type ion exchange polisher and membrane separation unit such as ultrafiltration unit and reverse osmosis unit successively to remove particles, colloidal materials, organic matter, metals and anions as much as possible, yielding high-purity water (secondary deionized water) suitable for rinse. In a commonly used configuration, high-purity water which is a permeate from the membrane separation unit of said secondary deionized water production section is generally supplied to the points of use via a side line branching from the circulating line, and any remaining high-purity water returns to the said primary deionized water reservoir via a return of said circulating line. The amount of water which returns to the primary deionized water reservoir via the return aqueduct is often about 10~30% of that of the permeate the membrane separation unit.

For example, high-purity water produced with the state-of-the art techniques for manufacturing LSI according to the submicron design rule has the water quality shown in Table 1. When such water of ultra pure quality is used, it is believed that no contaminating impurities derived from the high-purity water adhere to the surface during the rinsing step with said high-purity water.

TABLE 1

| Water quality of high-purity water | |
|---|---|
| Resistivity | >18.0 MΩ · cm |
| Total organic carbon | <10 μ gC/l |
| Number of particles | <10/cc (diam. >0.07 mμ) |
| CFU | <10/l |
| Dissolved oxygen | <10 μg O/l |
| Silica | <1 μg $SiO_2$/l |
| Sodium | <0.01 μg Na/l |
| Iron | <0.01 μg Fe/l |
| Copper | <0.01 μg Cu/l |
| Chloride ions | <μg Cl/l |
| Hydrogen ion concentration (pH) | 7 |
| Redox potential | +50 mV (vs. NHE) |

However, when electronic parts are required to have more highly clean surface, there have been problems such as those described below in the prior art.

That is, in said prior art, contaminating impurities which have been detached from the surfaces of electronic parts during the cleaning process using cleaning reagents (solutions thereof) remain near the surface of electronic parts in solution or in suspension. However, since said cleaning agents are capable of detaching contaminating materials from the surface of electronic parts, said contaminating materials once detached from the surface will never adhere again to the said surface so far as they are remaining in the said agent solution.

However, in the following rinsing process with high-purity water, since said cleaning reagents near the surface of electronic parts to be cleaned are diluted and removed with high-purity water, most of the contaminating materials remaining in said agent solutions near the surface of electronic components are also removed with said reagents, but a portion of the contaminating materials unavoidably remains near the said surface. Since said high-purity water used as rinse water has no ability to prevent contaminating materials from adhering to the surface of electronic parts to be cleaned, it cannot prevent most of the contaminating materials remaining near the said surface from adhering again to the surface of electronic parts to be cleaned.

Furthermore, in multi-bath cleaning apparatus, since plural wafers loaded on a wafer carrier or the like are transferred for cleaning successively from a cleaning bath for removing adherent materials with cleaning reagents, to a high-purity water bath, then further to a cleaning bath with cleaning reagents, wafers are soaked in reagent solutions or high-purity water in each cleaning bath. Therefore, contaminating materials which have been detached from the surface of wafers and diffused into the reagent solution in the cleaning bath are transferred with the liquid adhering to the wafers or wafer carriers to the next high-purity water cleaning bath, contaminating the high-purity water in the bath. In this case, also, since high-purity water is incapable of preventing contaminating materials from adhering to the surface, said contaminating materials adhere to the wafer's surface again.

For example, in the said cleaning process with the ammonia-hydrogen peroxide (5), since particles detached removed from the wafer's surface are present in the reagent solution, they will probably adhere to the surface again during the high-purity water rinsing process in the following step (6).

Furthermore, in the said cleaning process with hydrochloric acid-hydrogen peroxide (9), since metallic impurities detached the wafer's surface are present in the reagent solution, they will probably adhere to the surface again during the high-purity water rinsing process in the following step (10).

That is, in the prior art, there have been such a problem as contaminating materials detached once from the surface of electronic parts during the process for removing thereof with cleaning agents adhere again to the surface of said parts to be cleaned during the rinsing step with high-purity water. This problem cannot be solved even through further lowering of the concentration of impurities in high-purity water during the production of said high-purity water.

Furthermore, besides said problem, in the rinsing step with high-purity water following said cleaning step with sulfuric acid-hydrogen peroxide (1), because of the high viscosity of sulfuric ions, it is not easy to remove said ions from the surface of the silicon wafer. Therefore, there has been modification such as rinsing with warm high-purity water (higher than 80° C.). Such problem cannot be neglected, because it has been reported that sulfuric acid ions remaining on the wafer's surface makes said surface susceptible to contamination with metal and particulate in the succeeding steps. However, usage of such warm high-purity water leads to an increase in thermal energy cost.

SUMMARY OF THE INVENTION

The purpose of the present invention is to provide a method and apparatus for cleaning electronic parts or the like such as semiconductor substrates which are required to have extremely clean surfaces, wherein said method and apparatus are designed to prevent contaminating materials removed once from the surface of electronic parts or the like to be cleaned in the removing process with cleaning reagents from adhering to the said surface again in the following cleaning reagent rinse-off step.

The method of the present invention for rinsing electronic parts or the like features a rinsing treatment of semiconductor substrates, glass substrates, electronic parts and components of the manufacturing apparatus thereof which have been washed once with various cleaning solutions using anolyte electrolytic ionized water (EIW) or cathode EIW produced from deionized water.

Said anolyte or catholyte EIW is meant to be water obtained by electrolysis of deionized water or high-purity water in an electrolysis apparatus. There is no limitation in the type of electrolysis apparatus, which may be two-chambered or three-chambered. For example, in a three-chambered apparatus, wherein said apparatus consists of an anode chamber equipped with an anode, a cathode chamber equipped with a cathode and an intermediate chamber partitioned with a pair of ion exchange membranes or the like placed between said two chambers, and with pure water or high-purity water being supplied to each chamber, anolyte EIW is obtainable as an anolyte from said anode chamber and catholyte EIW as a catholyte from said cathode chamber. Preferably, said intermediate chamber is filled with a solid electrolyte such as an ion exchange resin or an ion exchange fiber.

Objects to be cleaned in the present invention can be exemplified by various materials and parts used in the field of manufacturing electronic parts, concretely, comprising substrate materials including semiconductor substrates such as silicon wafers and wafers of III–V group elements and glass substrates used for liquid crystals, memory elements, CPU and sensor elements, in the form of either finished products or semi-finished products, or components of the manufacturing apparatus such as a quartz reaction tube, rinsing bath and wafer carrier.

There is no limitation in the rinsing procedure, and any method including batch methods such as the overflow rinse method, quick dump rinse method, shower rinse method or sheet rinse method can be applied.

In the method of the present invention for rinsing off cleaning agents with EIW, preferably the nature of rinse water to be used is selected according to the kind of cleaning agent and the type of contaminant to be removed by rinsing.

For example, when sulfuric acid-hydrogen peroxide cleaning solution is used to remove organic matter, either an anolyte or catholyte EIW may be used for rinsing. Also when the ammonia-hydrogen peroxide cleaning solution is used to remove particles, catholyte EIW can be used to advantage for rinsing. Similarly, when the hydrochloric acid-hydrogen peroxide solution is used to remove adherent metallic materials, anolyte EIW is used to advantage for rinsing. When hydrofluoric acid solution is used to remove oxide films, catholyte EWI can be used to advantage for rinsing.

Furthermore, instead of the said anolyte or catholyte EIW produced from deionized water, the anolyte or catholyte EIW of electrolyte solution obtained by electrolysis of deionized water added with electrolytes may be used. Also an anolyte or catholyte EIW produced from deionized water and their added with acid or alkali may be used for rinsing.

By adding electrolytes such as acids or alkalis, the pH and redox potential of rinsing water can be adjusted to those most suitable for preventing impurities detached from adhering again to the surface.

Preferably, the acid and alkalis added to EIW produced from deionized water are those that are volatile and have low boiling points which hardly remain on the surface after rinsing followed by drying of the parts to be cleaned. For example, preferable acids are carbonic acid and organic acids including acetic acid, formic acid and chloroacetic acid, and a preferable alkali is ammonia. To add an acid or an alkali for producing an electrolytic solution of electrolyte solution, a small amount of acid or alkali, respectively, may be added to the water supplied to the anode chamber or cathode chamber, respectively, of the electrolysis apparatus. Instead, an acid, an alkali or a salt solution may be added into the intermediate chamber of the three-chambered electrolysis apparatus. By these methods, from the anode chamber can be obtained an acidic anolyte EIW with oxidizing activity, and from the cathode chamber an alkaline catholyte EIW with reducing activity. Furthermore, by adding alkali to the anode chamber can be also obtained an alkaline anolyte EIW with oxidizing activity and by adding acid to cathode chamber an acidic catholyte with reducing activity.

Since the concentration and amount of acid and alkali to be added may vary depending upon the extent of their effects on the re-adhesion of impurities detached during the cleaning process to the surface of parts to be cleaned, remaining amount after drying, extent of substrate damage, composition of acid or alkali to be used, type of substrates, etc., their concentrations cannot be fixed uniformly. However, in general, the concentration of acid to be added is that to bring the pH to 2~6, more preferably to 3~5, and that of the alkali to be added is to bring the pH to 8~12, more preferably to 9~11. Appropriate values to be selected can be determined experimentally.

Apart from the description above, in the conventional cleaning process with sulfuric acid-hydrogen peroxide followed by rinsing with an anolyte or catholyte EIW produced from deionized water, since it is not easy to remove sulfate acid ions from surface of silicon wafers because of the high viscosity of said ions, warmed high-purity water (>80° C.) has been used for rinsing. In contrast, the remarkable action of EIW has been confirmed, that is, sulfuric acid-hydrogen peroxide cleaning solution can be easily removed by rinsing with EIW at room temperature.

Another feature of the present invention is to provide apparatus for producing EIW produced from deionized water to be used in said rinsing process. Concretely, apparatus for cleaning electronic parts or the like, wherein said apparatus comprises a deionized water producing apparatus provided with at least any one ion exchanger, membrane separation unit and distillation apparatus, apparatus for cleaning semiconductor substrates, glass substrates, electronic parts and parts of the manufacturing apparatus thereof to be cleaned with various cleaning solutions followed by rinse treatment and an aqueduct for supplying deionized water produced by a deionized water producing apparatus to said apparatus for cleaning semiconductor substrates, etc., further provided with deionized water electrolysis apparatus for producing the anolyte and/or catholyte of EIW from deionized water on a side aqueduct branching from the main aqueduct for supplying deionized water as rinsing water.

In said cleaning apparatus, electrolysis apparatus placed along the aqueduct for supplying rinsing water can be used as electrolyte solution electrolysis apparatus for producing the anolyte and/or catholyte EIW of an electrolytic solution of electrolyte solution by electrolyzing supplied water with electrolyte added thereto. It is also possible to further provide means for adding acid or alkali to the anolyte and/or catholyte EIW produced from deionized water.

Using an apparatus in such a configuration, the pH and redox potential of rinsing water can be more easily adjusted as compared with the case using EIW simply produced form deionized water, leading to an improvement in the ability of the rinsing water to prevent contaminating impurities from adhering again to surface during rinsing process.

Said deionized water producing apparatus used in the cleaning apparatus of the present invention may be exemplified by such apparatus, wherein feed water is treated to produce deionized water by coagulation and sedimentation, sand filtration, active carbon adsorption, reverse osmosis, a two-bed ion exchange system, a mixed-bed ion exchanger and membrane separation using a precision filter, or feed water is treated by coagulation and sedimentation, sand filtration and distillation. In addition, said apparatus is exemplified especially by a high-purity water producing apparatus, wherein, for cleaning silicon wafer or the like required to have extremely clean surfaces, deionized water produced as described above is further treated successively with ultraviolet irradiation, a mixed-bed polisher and ultra-filtration to remove remaining particles, colloidal materials, organic matter, metals, anions, etc. as much as possible to yield highly purified water or so-called high-purity water. However, the deionized water producing apparatus of the present invention including said high-purity water producing apparatus is not limited by type and structure of treatment apparatus of each step composing a deionized water producing apparatus. Also there may be variations in the configuration of a deionized water producing apparatus, wherein deionized water treated not only by the final treatment step of said apparatus (often by a membrane separation unit), but also by at least any one ion exchanger, membrane separation unit and distillation unit (also called deionized water at this stage) omitting the succeeding treating step is supplied as rinsing water into the branching aqueduct.

Method and apparatus of the present invention are designed to clean electronic parts or the like, wherein parts cleaned with various reagent solutions are further rinsed with an anolyte or catholyte EIW produced from deionized water having the ability to prevent contaminating impurities from adhering again. Therefore, said method and apparatus enable the user to prevent contaminating impurities detached from said components by cleaning treatment with various cleaning solutions from adhering again to said parts to be cleaned during the rinsing process, and to efficiently remove surface contaminating materials. Furthermore, since the original water is high-purity water containing no impurities, no impurities are left on the parts to be cleaned even by direct drying of them after the rinsing process with EIW produced from deionized water (high-purity water).

Most preferred embodiments of the rinsing treatment with EIW produced form deionzied water and functions thereof will be described below for respective cleaning step with agents.

Rinse Treatment with EIW Produced from Deionized Water Following Cleaning with Particles Removing Reagents In general, particles such as silica suspended in solution are electrically charged positive in an acidic solution, and negative in an alkaline solution. Also the surface of silicon wafers to be cleaned, for example, is negatively charged in most cases. If a reducing alkaline EIW obtainable from the cathode side when high-purity water is subjected to electrolysis by direct current is used as rinse water, the particles suspended in solution are electrically negatively charged. Accordingly, the surface of parts to be cleaned are similarly negatively charged and the suspended solids and the surface of parts will repulse each other electrically, preventing particles from adhering to the surface of components to be cleaned. In contrast, by conventional rinse treatment with neutral high-purity water, particles are electrically positively charged, and attracted to the surface of parts.

Rinse Treatment with EIW Produced from Deionized Water Following Cleaning with Metal Removing Cleaning Solution In general, metals in solution become soluble and ionized easily under acidic oxidizing conditions. On the other hand, since metals adhering to a solid surface are either in the form of precipitated salts or in the form of precipitated atoms due to the exchange of electrons with the solid surface, the more acidic and oxidizing the solution becomes, the more hardly metals adhere to the surface. Accordingly, when oxidizing acidic EIW produced in the anode side during electrolysis of high-purity water by direct current is used as rinse water, such metal adhesion can be prevented. In contrast, metal adhesion cannot be prevented by the conventional rinse treatment with neutral high-purity water.

Rinse Treatment with EIW Produced from Deionized Water Following Cleaning with Organic Matter Removing Agent For example, organic matter on the surface of silicon wafers, for example, is removed by oxidative degradation of the organic matter with oxidizing agent. More Specifically, organic matter is either oxidized completely to organic compounds of low molecular weight, such as organic acids or carbon dioxide, and dissolved in agent solutions, or only detached from the surface of items to be cleaned and suspended as particles in agent solutions. In the former case, wherein organic matter is dissolved in an agent solution, when acidic and oxidizing EIW produced from high-purity water is used as rinse water, re-adhesion of organic matter to the solid surface to be cleaned during rinse process can be prevented by oxidizing degradation activity of the said anolyte EIW. Also, in the latter case, wherein organic matter is suspended as particles in reagent solution, when catholyte EIW produced from high-purity water is used as rinse water, re-adhesion of organic matter can be prevented by electric repulsion between the solid surface and the particles in the catholyte.

Rinse Treatment with Anolyte or Catholyte EIW Produced from f High-purity Water Following Cleaning with Sulfuric Acid-Hydrogen Peroxide Sulfuric acid-hydrogen peroxide cleaning solution which has been conventionally used as an agent for removing organic matter from silicon surface is often employed as a metal removing agent because of its high metal removing ability. After removal of adherent organic matter and metals using said sulfuric acid-hydrogen peroxide cleaning solution, re-adhesion of detached contaminating impurities to the solid surface during rinse treatment can be prevented by rinsing with an anolyte or catholyte EIW produced from deionized water or high-purity water. Said rinse treatment with anolyte or catholyte EIW following cleaning with sulfuric acid-hydrogen peroxide cleaning solution has the advantage of more efficient removal of the remaining sulfuric acid ions on the component to be cleaned (e.g., wafer) than conventional rinse treatment with high-purity water. Although the reason for this is not clear in detail, high wetting ability of electrolytic ions is assumed to be advantageous in the removal of sulfuric acid having high viscosity.
Rinse Treatment with Catholyte EIW Produced from Deionized Water Following Cleaning with an Oxide Film Removing Agent Growth rate of natural oxide film growing on the solid surface under solution depends on the redox potential, an index of dissolved oxygen and oxidizing matter. When a reducing and alkali EIW obtained from the cathode side during direct current electrolysis of high-purity water is used as rinse water, it can completely prevent the growth of a natural oxide film during the rinse operation.

When the pH and redox potential becomes adjustable by using, in place of anolyte or catholyte EIW produced from deionized water, anolyte or catholyte EIW of electrolyte solution obtained by electrolysis of deionized water added with electrolyte thereto, or by using an anolyte or catholyte produced from deionized water and then added with acid or alkali, rinse water of the most suitable conditions for preventing re-adhesion of detached impurities can be prepared.

For example, when anolyte EIW of electrolysis of electrolyte solution prepared by addition of a minute amount of acid to high-purity water is used as rinse water, the pH of the rinse water is lowered and the redox potential is elevated, resulting in increase of metal solubility and ability to prevent metal re-adhesion during the rinse process. A similar preventive effect is obtained by using an anolyte EIW produced from deionized water and then added with acid.

Acids to be added to high-purity water or anolyte EIW produced from deionized water are most preferably exemplified by carbonic acid, acetic acid, formic acid and chloroacetic acid as mentioned earlier.

Similarly, when catholyte EIW prepared by addition of a minute amount of alkali to high-purity water is used as rinse water, the pH of rinse water is elevated, and the electric repulsion between the surface of component to be cleaned and the particles are increased, resulting in an increase in ability to prevent particulate re-adhesion during the rinse process. A similar preventive effect is obtained by using catholyte EIW produced from deionized water and added with alkali.

An alkali to be added to high-purity water or a catholyte EIW produced from deionized water is most preferably exemplified by ammonia.

DETAILED DESCRIPTION OF THE PREFERRED EMBODIMENTS

The concrete configuration of apparatus of the present invention will now be described with reference to the accompanying drawings which exemplarily illustrate preferred embodiments thereof.

Embodiment 1

Figure 1:
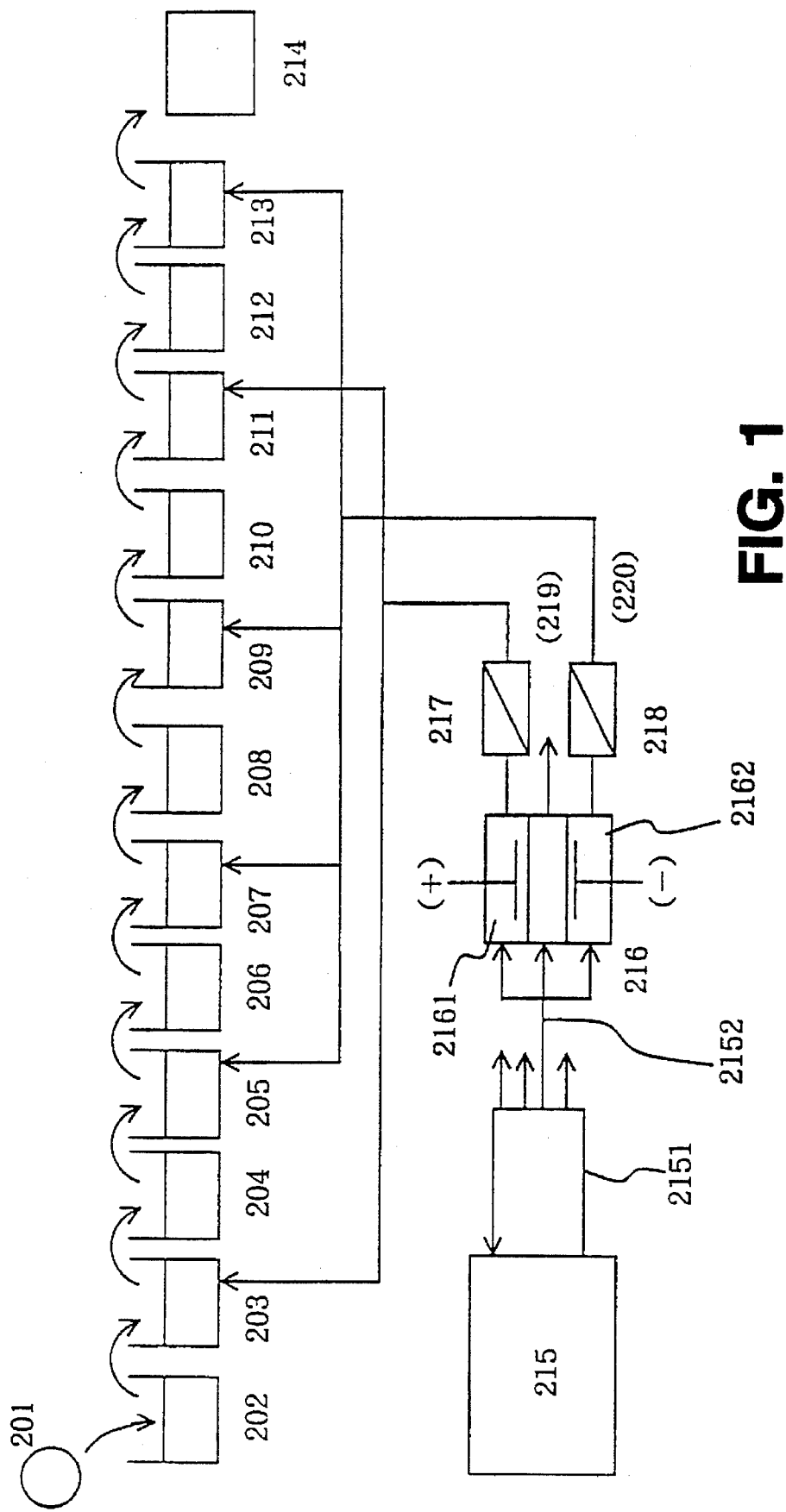
FIG. 1 is a block diagram showing the configuration of the first embodiment of the cleaning apparatus of the invention.

FIG. 1 is a block diagram showing the configuration of the first embodiment of the present invention. In this figure, numerals 202–213 denote each cleaning bath and rinse bath composing a batch type cleaning apparatus for silicon wafers. Among them, numeral 202 denotes a cleaning bath using sulfuric acid-hydrogen peroxide cleaning solution, numeral. 204, 208 and 212 cleaning baths using hydrofluoric acid cleaning solution, numeral 206 a cleaning bath using ammonia-hydrogen peroxide cleaning solution, and numeral 210 a cleaning bath using hydrochloric acid-hydrogen peroxide cleaning solution. Rinse baths 203, 205, 207, 209, 211 and 213 are placed right behind each cleaning bath.

In this embodiment, rinse baths 203 and 211 are supplied with anolyte EIW produced from high-purity water, and rinse baths 205, 207, 209 and 213 are supplied with catholyte EIW produced from high-purity water.

While silicon wafer 201 is transferred into each bath from 202 through 213 aligned as described above in the direction indicated by arrows, said wafer is successively subjected to processes for removing organic matter, particles and adherent metal, and right after each process subjected to an oxide film removing process with hydrofluoric acid solution and finally to a spin dryer 214 for drying.

A feature of the present invention is to supply high-purity water, which is produced by high-purity water producing apparatus 215, comprising a primary deionized water producing section for producing primary deionized water by treating feed water with coagulation and sedimentation unit, reverse osmosis membrane separation unit, a two-bed ion exchange unit, mixed-bed ion exchanger and membrane separation using a micronic membrane filter and a secondary deionized water producing apparatus (neither shown in FIG. 1) for producing high-purity water by UV irradiation, mixed-bed polisher and ultrafiltration, to a three-chambered high-purity water electrolysis apparatus 216 placed along the aqueduct 2152 for supplying rinse water branching from the main recirculation aqueduct 2151. Said electrolysis apparatus 216 is so featured that anolyte 219 from anode chamber 2161 is supplied to said rinse baths 203 and 211, and catholyte 220 from cathode chamber 2162 to said rinse baths 205, 207, 209 and 213. Furthermore, on aqueducts for supplying anolyte 219 and catholyte 220 are placed filters 217 and 218, respectively.

Figure 2:
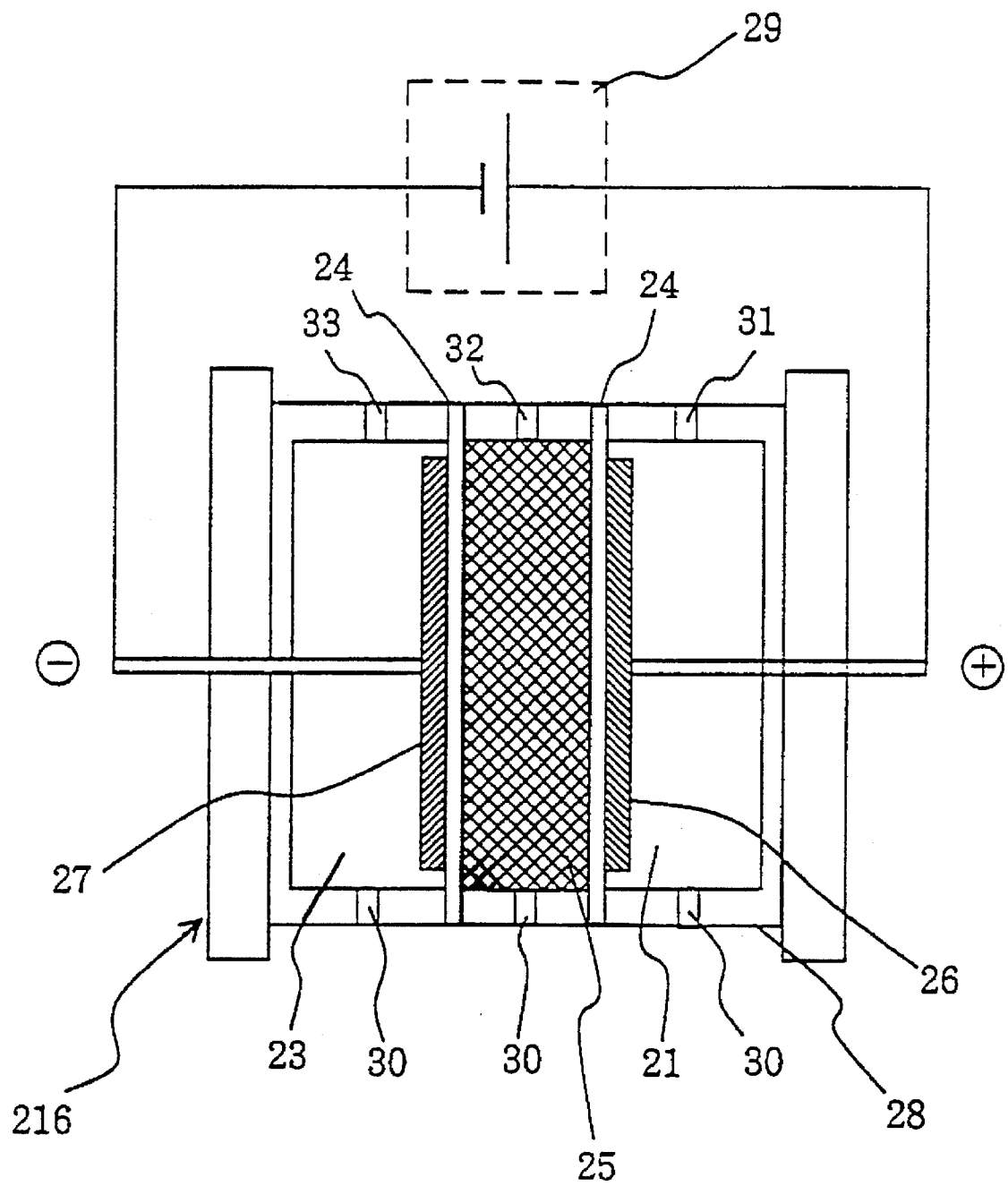
FIG. 2 is a block diagram showing the configuration of the deionized water electrolysis apparatus used in the cleaning apparatus shown in FIG. 1.

In the configuration described above, wherein high-purity water electrolysis apparatus 216 is placed on an aqueduct for supplying rinse water branching from the point of use on the circulating system 2151 of high-purity water producing apparatus 215, aqueducts to each rinse bath can be less than 10 odd meters to several tens meter long at most, facilitating quick supply of water treated with high-purity water electrolysis apparatus to the rinse bath. Therefore, said configuration is preferable in that the ability of rinse water to prevent adhesion of impurities can be utilized with no practical degradation during its transit. Said three-chambered high-purity water electrolysis apparatus 216 of the present invention, as shown in FIG. 2, consists of anode chamber 21, cathode chamber 23, ion exchange membrane 24 which is a solid electrolyte and intermediate chamber partitioned by a pair of ion exchange membranes 24. High-purity water is supplied to each chamber through deionized water inlet 30, 30 and 30. The intermediate chamber is filled with solid electrolyte ion exchange resin 25.

High-purity water is electrolyzed by direct electric current provided between anode 26 placed in anode chamber 21 and cathode 27 placed in cathode chamber 23, and the anolyte thus produced 219 is supplied through anolyte outlet 31 to said each rinse bath via filter 217. The direct electric current is provided by a power source 29 placed between anode 26 and cathode 27. And catholyte thus produced 220 is supplied through catholyte outlet 33 to said each rinse chamber via filter 218. Numeral 32 denotes outlet of intermediate chamber water, and numeral 28 frame of electrolysis chamber.

In the configuration described above, when high-purity water electrolysis apparatus shown in FIG. 2 electrolyses high-purity water containing almost no electrolyte, the ion exchange membranes of solid electrolyte 24 between anode 26 and cathode 27 as well as ion exchange resin 25 serve as electron carriers, facilitating electrolysis of high-purity water at low voltage. It is also advantageous that intermediate chamber 32 prevents mixing of solutions in anode chamber 21 and cathode chamber 23.

Using a cleaning apparatus, wherein high-purity water electrolysis apparatus explained with reference to FIG. 2 is installed in high-purity water producing apparatus 215 shown in FIG. 1 capable of producing high-purity water having water quality shown in said Table 1, anolyte and catholyte EIW produced from high-purity water were produced under the following electrolytic conditions, and used to rinse silicon wafers which had been cleaned with ammonia-hydrogen peroxide to remove particles in said step (5) or with hydrofluoric acid to remove natural oxide film in said step (7). Particulate numbers were counted with a laser particle counter, and the thickness of native oxide film measured with a XPS (X ray photoelectric spectrometer). Results are summarized in Table 2. Cleaning and rinse conditions are shown under Table 2.

Conditions of Electrolysis

The voltage between anode and cathode of a three-chambered electrolysis apparatus was 20 V, and the density of electrolysis current was 4.6 A/dm$^2$.

Conditions of Rinse

Using a rinse bath, wherein EIW produced from high-purity water can be overflowed, wafers were held stationarily in said bath and rinsed with said water flowing at a line or velocity of 5 m/h for 10 min.

The same wafers were also rinsed with high-purity water not electrolyzed under the same conditions described above, and then the remaining adherent particulate and thickness of native oxide film were measured. Results are shown similarly in Table 2 below.

TABLE 2

Thickness of native oxide film and number of adherent particles on silicon wafer's surface after rinse

| | Rinse water | |
|---|---|---|
| | Conventional high-purity water (not subjected to electrolysis) | Catholyte of electrolytic deionized e water (Catholyte EIW produced from high-purity water was used in steps (6) and (8)) |
| Average thickness of oxide film (nm) | 0.27 | <0.1 |
| Average number of adherent particles (diam. >0.1 μm) per wafer | 12 | 2 |

| | | |
|---|---|---|
| (5) Cleaning with ammonia-hydrogen peroxide (ammonium water:hydrogen peroxide solution: high-purity water = 0.05:1:5, by volume) | | 10 min |

TABLE 2-continued

| | | |
|---|---|---|
| (6) Rinse with catholyte of EIW produced from deionized water or high-purity water | | 10 min |
| (7) Cleaning with hydrofluoric acid (hydrofluoric acid 0.5%) | | 1 min |
| (8) Rinse with catholyte of EIW produced from deionized water or high-purity water | | 10 min |

Similarly, silicon wafers which had been cleaned with hydrochloric acid-hydrogen peroxide of said step (9) or with hydrofluoric acid of said step (11), respectively, were rinsed, and concentrations of adherent copper were determined. Results are shown in Table 3. Conditions of cleaning and rinse were described under Table 3. Adherent metal (Cu) was measured by TREX (total reflex fluorescent x-ray analyzer) using the same rinse treatment as above.

TABLE 3

| | Rinse water | |
|---|---|---|
| | Conventional high-purity water (not subjected to electrolysis) | Catholyte of EIW produced from deionized water (Catholyte EIW produced from high-purity was used in steps (10) and (12)) |
| Copper concentration (atoms/cm$^2$) | $5.5 \times 10^{10}$ | $<1 \times 10^{10}$ |

| | | |
|---|---|---|
| (9) Cleaning with hydrochloric acid-hydrogen peroxide (hydrochloric acid:hydrogen peroxide solution:high-purity water = 1:1:6, by volume) | | 10 min |
| (10) Rinse with anolyte of EIW produced from deionized water, or with high-purity water | | 10 min |
| (11) Cleaning with hydrofluoric acid (hydrofluoric acid 0.05%) | | 1 min |
| (12) Rinse with anolyte EIW produced from deionized water, or with high-purity water | | 10 min |

Also, quality of each rinse water in rinse bath in said rinse operation are shown in Tables 4 and 5.

TABLE 4

Water quality of high-purity water in high-purity water rinse bath during high-purity water rinse process
(Rinse water used at room temperature after cleaning with ammonia-hydrogen peroxide (step 6))

| | Rinse water | |
|---|---|---|
| | Conventional high-purity water (not subjected to electrolysis) | High-purity water producing apparatus of the present invention (catholyte EIW produced from high-purity water was used in steps (6), (8) and (12)) |
| Total organic carbon μg C/l | 0.5 | 0.5 |
| Number of particle/cc (diam. >0.07 μm) | 120–140 | 120–140 |
| CFU | 1 | 1 |
| Dissolved oxygen μg O/l | 40 | <2 |
| Silica μg SiO$_2$/l | <0.2 | <0.2 |
| Sodium μg Na/l | <0.003 | <0.003 |
| Copper μg Cu/l | <0.005 | <0.005 |

TABLE 4-continued

Water quality of high-purity water in high-purity water rinse
bath during high-purity water rinse process
(Rinse water used at room temperature after cleaning with
ammonia-hydrogen peroxide (step 6))

| | Rinse water | |
|---|---|---|
| | Conventional high-purity water (not subjected to electrolysis) | High-purity water producing apparatus of the present invention (catholyte EIW produced from high-purity water was used in steps (6), (8) and (12)) |
| Hydrogen ion concentration (pH) | 6.5 | 8.1 |
| Redox potential mV (versus NHE) | +380 | −600 |

TABLE 5

Water quality of high-purity water in high-purity water
rinse bath during high-purity water rinse process
(Rinse water used at room temperature after cleaning with
hydrochloric acid-hydrogen peroxide (step 10))

| | Rinse solution | |
|---|---|---|
| | Conventional high-purity water (not subjected to electrolysis) | High-purity water producing apparatus of the present invention (catholyte EIW produced from high-purity water was used in stops (2) and (10)) |
| Total organic carbon μg C/l | 0.5 | 0.5 |
| Number of particle/cc (diam. >0.07 μm) | 1~2 | 1~2 |
| Number of viable microbe cell /l | 2 | 0 |
| Dissolved oxygen μg O/l | 40 | 30000 |
| Silica   μg $SiO_2$ | <0.2 | <0.2 |
| Sodium  μg Na/l | <0.003 | <0.003 |
| Copper  μg Cu/l | <0.005 | <0.005 |
| Hydrogen ion concentration (pH) | 6.5 | 3.8 |
| Redox potential mV (vers. NHE) | +380 | +720 |

Results in Table 2 show that, by rinsing with catholyte EIW produced from high-purity water following cleaning with hydrofluoric acid, the average thickness of oxide film on the surface of the silicon was reduced, indicating that the reducing anolyte used as rinse water after cleaning with hydrofluoric acid to remove native oxide film inhibits the growth of native oxide film during the rinsing process.

Also by using catholyte EIW produced from high-purity water as rinse water after cleaning with ammonia-hydrogen peroxide as rinse, the number of adherent particles on the silicon surface was reduced. These results indicate that reducing alkaline catholyte used as rinse water after cleaning with ammonia-hydrogen peroxide prevents adhesion of particles by electric repulsion between the particles suspended in solution and the silicon surface.

Although a rinse bath, wherein EIW produced from high-purity water to be used as rinse water can be overflowed from the top of said bath, was used in the present embodiment, a shower rinse bath, wherein high-purity water is showered over the surface of a semiconductor, may be used. Also, rinsing semiconductors with EIW produced from deionized water in a rinse bath or shower rinse bath, instead of holding the semiconductors stationary during the rinse operation, mechanical shaking or rotation of them may be combined in the rinse operation.

Embodiment 2

Figure 3:
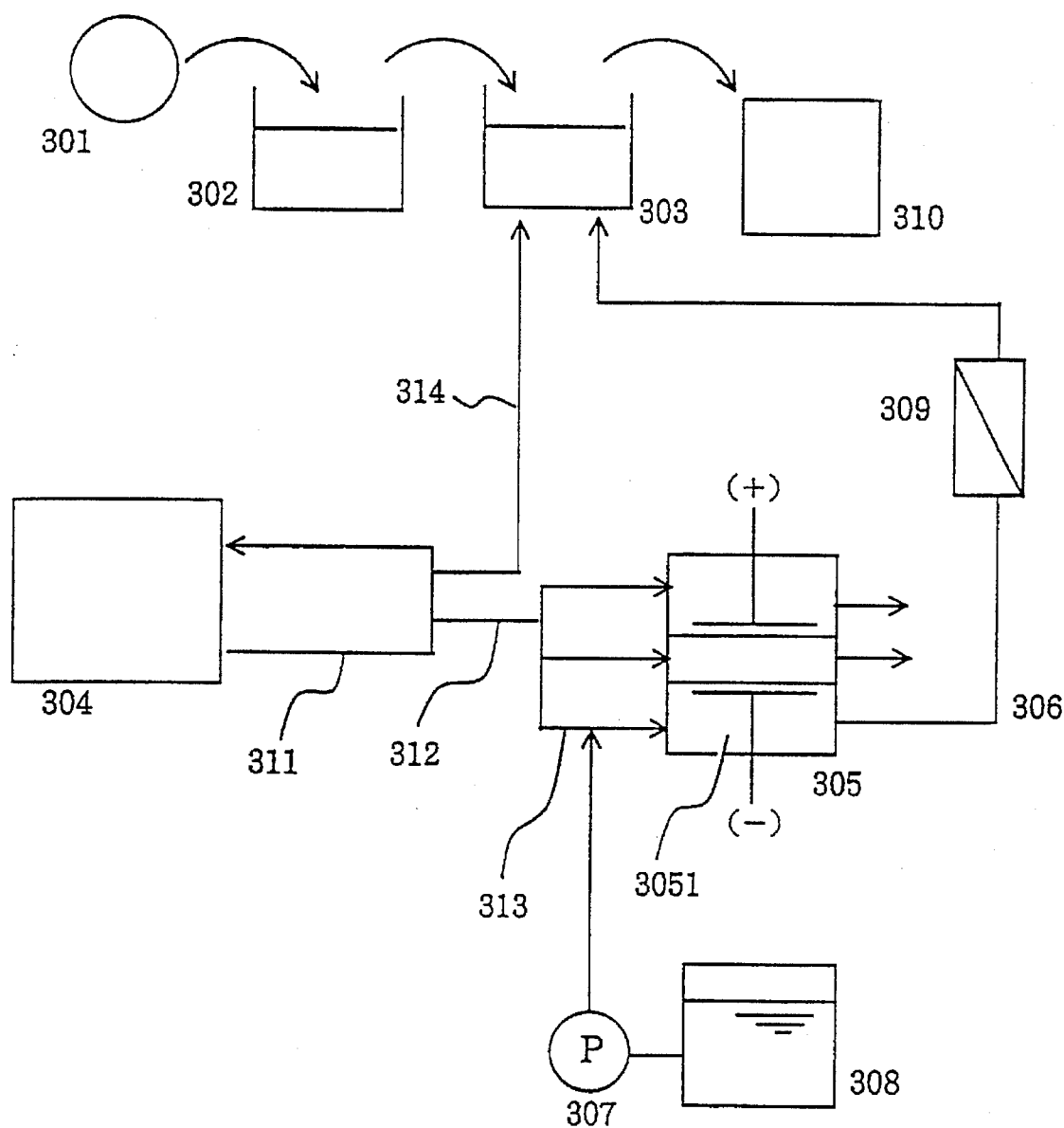
FIG. 3 is a block diagram showing the configuration of the second embodiment of the cleaning apparatus of the invention.

In the second embodiment, a cleaning apparatus as shown in FIG. 3 is employed, wherein said apparatus is provided with rinse bath 303 following the bath used for batch cleaning of the silicon semiconductors 302 and also provided with a spin dryer 310, to which silicon wafers 301 are transferred for drying after they are cleaned in said cleaning bath 302 and then in rinse bath 303.

Apparatus of the present embodiment, in a similar manner to that of the first embodiment, is provided with apparatus for electrolyzing electrolyte solution 305 on an aqueduct 312 for supplying rinse water branching from the point of use circulating system 311 of high-purity water producing apparatus 304. Furthermore, in this configuration, said apparatus for electrolyzing electrolyte solution 305 is provided with aqueduct 313 further branching from aqueduct 312 for supplying high-purity water to cathode chamber 3051, and further equipped with a means for supplying ammonia water to said aqueduct 313. Catholyte 306 of electrolytic solution of electrolyte solution obtained by said apparatus 305 for electrolyzing electrolyte solution is supplied as rinse water to said rinse bath 303 via filter 309.

Said means for adding ammonia water into aqueduct 313 of the present embodiment has such configuration that ammonia water is added into high-purity water inside aqueduct 313 from ammonia water reservoir 308 by means of infusion pump 307 to supply water containing 4 ppm ammonia to cathode chamber.

Apparatus for electrolyzing electrolyte solution in the present embodiment 305 has structure similar to that of the three-chambered apparatus explained with reference to FIG. 2. Since solution supplied to cathode chamber contains ammonia at 4 ppm concentration, catholyte produced by direct current electrolysis is a dilute ammonia electrolytic solution.

For a comparative test, apparatus for electrolyzing high-purity water 311 is provided with another aqueduct 314 for supplying high-purity water from circulating system 311 directly to rinse bath 303.

Setting up cleaning apparatus, as shown in FIG. 3, provided with said apparatus for electrolyzing electrolyte solution 305, catholyte EIW was produced, and used for rinsing silicon wafers which had been previously contaminated with PSL (polystyrene latex) particles and washed with ammonia-hydrogen peroxide cleaning solution (ammonia water:hydrogen peroxide solution:high-purity-water= 0.05:1:5, by volume) for 10 min under similar conditions to those in the first embodiment. The remaining adherent particles were measured in a similar manner to that of the first embodiment and the results are shown in Table 6. Electrolysis was carried out under conditions, wherein the electrode voltage between anode and cathode was 9 V and the electrolysis current density was 4.6 A/dm$^2$.

As a control, except that high-purity water, instead of 4 ppm ammonia water, was supplied to cathode chamber, and said wafers were similarly rinsed and adherent particles were measured. Results are shown in Table 6. Electrolysis conditions in this case were the same to those in the first embodiment.

Also, as comparison, high-purity water without electrolysis was directly supplied to rinse bath 303 via aqueduct 314, and the wafers were similarly rinsed and the remaining adherent particles were counted. Results are similarly shown in Table 6.

TABLE 6

|  | Rinse water | | |
| --- | --- | --- | --- |
|  | Before rinse | Conventional high-purity water | Catholyte of electrolysis of high-purity water | Catholyte of electrolysis of diluted ammonia water |
| Average number of adherent particles (>0.1 μm)/wafer | >9999 | 115 | 13 | 5 |

From results in Table 6, it was confirmed that rinse treatment with catholyte produced by electrolysis of high-purity water or 4 ppm ammonia water following cleaning with ammonia-hydrogen peroxide significantly reduces number of adherent particles as compared with the conventional rinse treatment with high-purity water. It was also confirmed that the rinse treatment with catholyte produced by electrolysis of 4 ppm ammonia water more efficiently reduces number of adherent particles than that with catholyte produced by electrolysis of high-purity water. Results indicate that the pH of catholyte was increased by the addition of ammonia to water supplied to the cathode chamber, leading to elevation of electric repulsion between particles inside the solution and the silicon surface and improvement of activity to prevent re-adhesion of particles.

Embodiment 3

Figure 4:
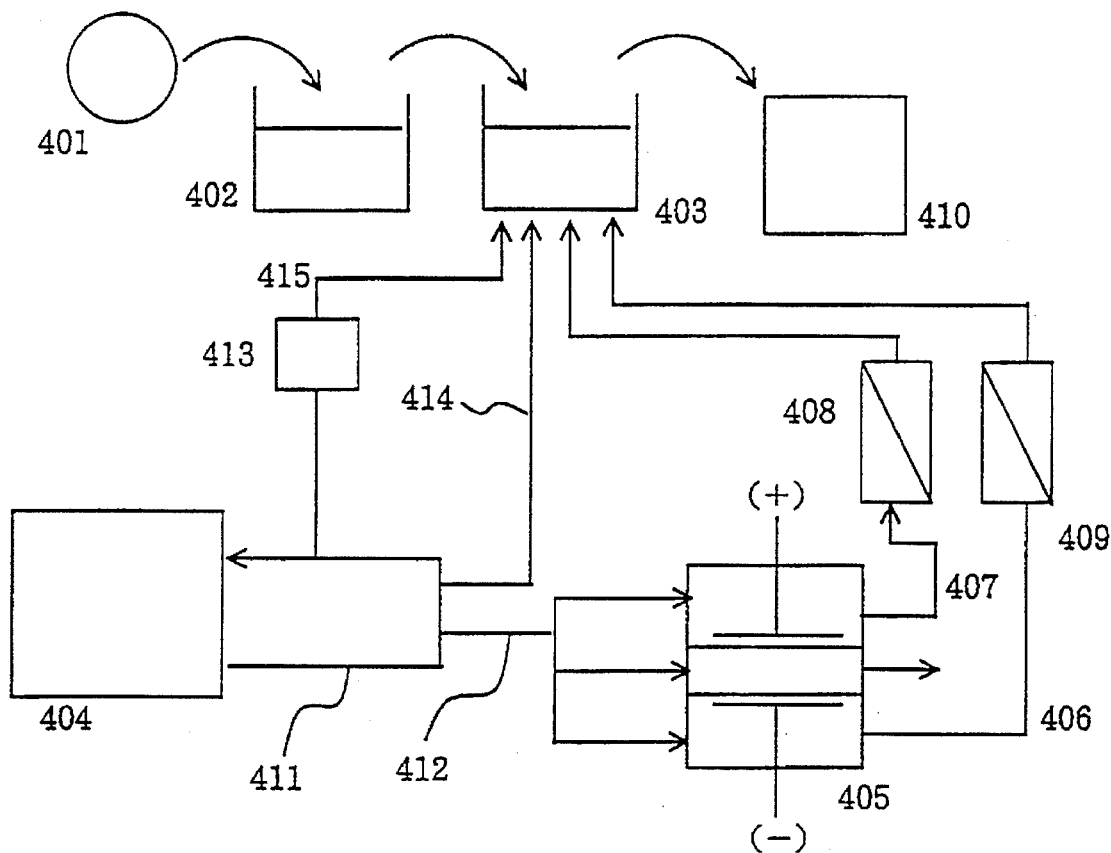
FIG. 4 is a block diagram showing the configuration of the third embodiment of the cleaning apparatus of the invention.

In the present embodiment, an apparatus shown in FIG. 4 is employed, wherein said apparatus is provided with rinse bath 403 following a bath used for the batch cleaning of silicon wafers 402 and further provided with spin dryer 410, to which silicon wafers 401 are transferred for drying after they are cleaned in said cleaning bath 402 and then in rinse bath 403.

Apparatus of the present embodiment, in a similar manner to that of the first embodiment, features in that said apparatus is provided with apparatus for electrolyzing high-purity water 405 on aqueduct 412 for supplying rinse water branching from the point of use circulating system 411 of high-purity water producing apparatus 404. In this configuration, catholyte (406) and anolyte (407) EIW produced from high-purity water produced by said apparatus 405 for electrolyzing high-purity water are supplied as rinse water via filters 409 and 408, respectively, to said rinse bath 403.

Apparatus for electrolyzing electrolyte solution (high-purity water) in the present embodiment 405 has configuration similar to that of the three-chambered electrolysis apparatus explained with reference to FIG. 2.

For comparative test, cleaning apparatus of the present embodiment was equipped with aqueduct 414 for supplying high-purity water directly from circulation system 411 of high-purity water producing apparatus to rinse bath 403. Said cleaning apparatus was further equipped with another aqueduct 415 branching from circulation system 411 for supplying warm high-purity water which had been warmed to 80° C. by heater 413.

Setting up cleaning apparatus, as shown in FIG. 4, provided with said apparatus for electrolyzing high-purity water 405, a catholyte and anolyte EIW produced from high-purity water were produced under electrolysis conditions similar to those in the first embodiment, and used for rinsing silicon wafers 401 under similar conditions to those in the first embodiment which had been cleaned with sulfuric acid-hydrogen peroxide (sulfuric acid:hydrogen peroxide solution=4:1, by volume) for 10 min. The amount of sulfate ion remaining on wafers was measured and the results were shown in Table 7.

Sulfate ion was measured using hot-water extraction ion chromatography. At the same time the copper concentration was also measured by the same method used in the first embodiment.

Also, as comparison, high-purity water without electrolysis and high-purity water warmed to 80° C., respectively, were supplied to rinse bath 403 via aqueducts 414 and 415, respectively, to rinse wafers under the same conditions, and the amount of remaining sulfate ion and concentration of copper were measured. Results are shown in Table 7 below.

The temperature of anolyte, catholyte and high-purity water without electrolysis used as rinse water was adjusted to 25° C.

TABLE 7

| Remaining ion concentration after washing with sulfuric acid-hydrogen peroxide cleaning solution | | | | |
| --- | --- | --- | --- | --- |
|  | Rinse water | | | |
|  | Conventional high-purity water (25° C.) | Warm high-purity water (80° C.) | Anolyte of electrolysis of high-purity water (25° C.) | Catholyte of electrolysis of high-purity water (25° C.) |
| Amount of sulfate ion remaining on silicon wafers (ion concentration atoms/cm$^2$) | $1 \times 10^{13}$ | $9 \times 10^{11}$ | $7 \times 10^{11}$ | $9 \times 10^{11}$ |
| Copper concentration (atoms/cm$^2$) | $7.0 \times 10^{10}$ | $5.5 \times 10^{10}$ | $<1 \times 10^{10}$ | $4.5 \times 10^{10}$ |

From results in Table 7, it was confirmed that rinse treatment with an anolyte or catholyte produced by electrolysis of high-purity water or with warm high-purity water following cleaning with sulfuric acid-hydrogen peroxide significantly reduces the amount of remaining sulfate ions as compared with conventional rinse treatment with high-purity water. It was also confirmed that, especially, the rinse treatment with an anolyte more efficiently removes sulfate ion than that of warm high-purity water.

Furthermore, among rinse treatments tested, that with acidic, oxidizing anolyte with high activity to prevent metal adhesion resulted in the lowest concentration of copper ions. It was also indicated that the rinse treatment with warm high-purity water and a catholyte reduces somewhat greater numbers of copper ions when compared with the conventional rinse treatment with high-purity water. This is probably due to the sulfate ion removing activity of these rinse solutions.

It may be concluded that, taking the running cost of warming high-purity water and the amount of adherent metal into consideration, a rinse treatment with anolyte after washing with sulfuric acid-hydrogen peroxide may be preferable in most cases with apparatus on an industrial scale.

Cleaning method of the present invention, wherein EIW produced from deionized water, EIW produced from deionized added with electrolyte(s) and added with acid or alkali EIW produced from deionized water are used as the rinse solution, is advantageous in that electronic parts or the like especially such as semiconductor substrates which are required to have extremely clean surfaces can be rinsed without causing re-adhesion of contaminating materials, which have been detached from the surface of the part to be cleaned, to the surface of the electronic parts or the like in the next step.

Therefore, as compared with conventional cleaning methods comprising rinse treatment with high-purity water following cleaning with reagents, the method of the present invention is more effective for obtaining a more highly cleaned surface.

Also, since the method of the present invention can prevent adhesion of contaminating materials derived from agents which are brought into a rinse bath, the said method is effective for efficient utilization of resources, in addition to economical effect such as longer half-life and less often exchange of reagents.

Furthermore, the rinsing apparatus of the present invention, wherein said apparatus is provided with deionized or high-purity water electrolysis apparatus on an aqueduct for supplying rinse water branching from a main aqueduct of deionized water (high-purity water) producing apparatus, is effective for carrying out said cleaning with EIW produced from deionized water or the like. Especially, when said rinsing apparatus is further provided with deionized water (high-purity water) electrolysis apparatus downstream from the point of use branching from the circulation system of a pure water producing apparatus, extended length of aqueduct for supplying anolyte or catholyte produced by said electrolysis apparatus to the rinse bath is relatively short, so that the said apparatus is effective for utilizing activity of anolyte and catholyte thus produced to prevent adhesion of contaminating materials.

What is claimed is:

1. A method for cleaning electronic parts or the like, comprising:

cleaning said electronic parts with a cleaning solution; and rinsing said cleaned electronic parts with anolyte or catholyte electrolytic ionized water (EIW) which is obtained by electrolyzing deionized water, wherein the EIW is used as a rinsing solution and includes less than 0.1% ions.

2. The method as defined in claim 1, further comprising; adding an electrolyte or electrolytes to said deionized water which will be electrolyzed.

3. The method as defined in claims 2, wherein said cleaning solution is for removing organic matter; and said anolyte EIW is used as said rinsing solution in said rinsing.

4. The method as defined in claim 2, wherein said cleaning solution is for removing organic matter; and said catholyte EIW is used as said rinsing solution in said rinsing.

5. The method as defined in claim 2, wherein said cleaning solution is for removing fine particles, and said catholyte EIW is used as said rinsing solution.

6. The method as defined in claim 2, wherein said cleaning solution is for removing adherent metals.

7. The method as defined in claim 1, further comprising adding an electrolyte or electrolytes to said EIW which is used as said rinsing solution in said rinsing, wherein the electrolyte or electrolytes are acids or alkalis.

8. The method as defined in claim 7, wherein said cleaning solution is for removing organic matter; and said anolyte EIW is used as said rinsing solution in said rinsing.

9. The method as defined in claim 7, wherein said cleaning solution is for removing organic matter; and said catholyte EIW is used as said rinsing solution in said rinsing.

10. The method as defined in claim 7, wherein said cleaning solution is for removing fine particles, and said catholyte EIW is used as said rinsing solution.

11. The method as defined in claim 7, wherein said cleaning solution is for removing adherent metals.

12. The method as defined in claim 1, wherein said cleaning solution is for removing organic matter; and said anolyte EIW is used as said rinsing solution in said rinsing.

13. The method as defined in claim 12, wherein said cleaning solution is a sulfuric acid-hydrogen peroxide solution.

14. The method as defined in claim 1, wherein said cleaning solution is for removing organic matter; and said catholyte EIW is used as said rinsing solution in said rinsing.

15. The method as defined in claim 14, wherein said cleaning solution is a sulfuric acid-hydrogen peroxide solution.

16. The method as defined in claim 1, wherein said cleaning solution is for removing fine particles, and said catholyte EIW is used as said rinsing solution.

17. The method as defined in claim 1, wherein said cleaning solution is for removing adherent metals.

18. The method of claim 1, wherein said cleaning solution is for removing oxide films; and said rinsing solution is said catholyte EIW.

19. An apparatus for cleaning electronic parts or the like, said apparatus comprising:

a deionized water producing apparatus comprising ion exchange apparatus, membrane separation apparatus and distillation apparatus configured to produce deionized water;

a cleaning apparatus for cleaning electronic components with a cleaning solution and then rinsing the electronic components with a rinsing solution; and an electrolysis apparatus for producing anolyte and/or catholyte electrolytic ionized water (EIW) produced from said deionized water from said deionized water producing apparatus and supplying said anolyte and/or catholyte to the cleaning apparatus as said rinsing solution for said rinsing;

wherein said electrolysis apparatus is disposed on a branching pipe for said deionized water, and wherein said rinsing solution includes less than 0.1% ions.

20. The apparatus of claim 9, further comprising an adding apparatus or apparatuses for adding an electrolyte or electrolytes to water supplied to an input of said electrolysis apparatus.

21. The apparatus of claim 19, further comprising an adding apparatus or apparatuses for adding an electrolyte or electrolytes to the EIW produced by said electrolysis apparatus.

* * * * *